(12) United States Patent
Huang

(10) Patent No.: US 8,476,710 B2
(45) Date of Patent: Jul. 2, 2013

(54) VERTICAL COMPLEMENTARY FET

(75) Inventor: Qin Huang, Wuxi (CN)

(73) Assignee: Wuxi Versine Semiconductor Corp., Ltd., Wuxi, Jiangsu Province (CN)

( * ) Notice: Subject to any disclaimer, the term of this patent is extended or adjusted under 35 U.S.C. 154(b) by 0 days.

(21) Appl. No.: 13/413,175

(22) Filed: Mar. 6, 2012

(65) Prior Publication Data

US 2012/0228698 A1    Sep. 13, 2012

(30) Foreign Application Priority Data

Mar. 9, 2011    (CN) .......................... 2011 1 0056548

(51) Int. Cl.
*H01L 23/62*    (2006.01)
(52) U.S. Cl.
USPC .................................. 257/357; 257/E27.063
(58) Field of Classification Search
USPC ................. 257/350–351, 355–357, 368–370, 257/328, E27.063; 438/322, 199–200
See application file for complete search history.

(56) References Cited

U.S. PATENT DOCUMENTS

| | | | | |
|---|---|---|---|---|
| 4,805,008 A | * | 2/1989 | Yao et al. | 257/376 |
| 4,896,196 A | * | 1/1990 | Blanchard et al. | 257/139 |
| 6,465,291 B1 | * | 10/2002 | Disney | 438/188 |
| 6,611,021 B1 | * | 8/2003 | Onishi et al. | 257/328 |
| 6,642,583 B2 | * | 11/2003 | Jimbo et al. | 257/372 |
| RE42,403 E | * | 5/2011 | Babcock et al. | 257/401 |

* cited by examiner

*Primary Examiner* — Matthew W Such
*Assistant Examiner* — Ali Naraghi
(74) *Attorney, Agent, or Firm* — Jacobson Holman PLLC; Jiwen Chen

(57) ABSTRACT

A vertical complementary field effect transistor (FET) relates to the production technology of semiconductor chips and more particularly to the production technology of power integration circuit. A part of the substrate bottom of the invention extends into the middle layer and form the plug between the two MOS units. There is an output terminal under the substrate layer. When on-state voltage is applied on the gate electrode of the two MOS units, two conduction paths are formed from MOS unit-plug-substrate to the output terminal. This technology can integrate more than two MOS devices. Therefore, the die size is reduced.

4 Claims, 4 Drawing Sheets

VERTICAL COMPLEMENTARY FET

The present application claims the priority of Chinese Application No. 201110056548.4, filed Mar. 9, 2011, under 35 U.S.C. §119, which is hereby incorporated by reference.

TECHNICAL FIELD

The present invention relates to semiconductor technology and more particularly to a type of vertical complementary field effect transistor (FET) which is used as building blocks in DC/DC converters.

BACKGROUND OF THE INVENTION

At present, building blocks are widely used in a variety of circuit designs and production. Building blocks include power switches, inductors and capacitors. In order to increase the power density and switching frequency, it is necessary to design highly integrated building blocks.

FIG. 1 shows a schematic of DC-DC converter. SW1 and SW2 are two MOS switches. In this circuit, using CMOS technology, SW1 and SW2 could be integrated in a building block. The existing integrated MOS structure is shown in FIG. 2, in which two MOS units with contrary polarity are located on the p-substrate and n-well, respectively. The source and drain electrodes of SW1 and SW2 are both on the surface. The drain electrode of SW1 and the source electrode of SW2 are connected to the Vin and GND respectively. The drain electrode of SW2 and the source electrode of SW1 are connected and provide the voltage potential VX, which is controlled by the switching of SW1 and SW2.

Such structure has the following problems: 1) Because of the side-current, the lateral structure is subject to the self-bias-effect in the P-substrate and the N-well. Therefore, the die size and the output current of the converter are limited. 2) Its breakdown voltage is lower than that of the discrete structure. 3) The power density and the die size are also limited by the current electrode (Vin, GND, VX) and the surface of the chip.

CONTENT OF THE INVENTION

In order to solve the problems in the current technology, the present invention presents a vertical complementary FET and the method of making it. The improved the chip structure reduces the limitations on the die size and increases the breakdown voltage.

The following methods are used by the present invention. The vertical complementary FET comprises at least two MOS units. It includes a substrate layer and a middle-layer on top of the substrate layer. There is a well region in the middle-layer and the corresponding point of the MOS unit. The polarity of the substrate layer is the same as the middle layer and is contrary to the well region. Said every MOS unit includes a pair of PN electrode and a gate electrode. The polarities of the PN electrode of the two MOS unit are contrary to each other. One pair of electrodes are on the middle layer and can form conducting channel in the middle layer controlled by the gate electrode. Another pair of electrodes are on the well and can form conducting channel under the control of the gate electrode. A part of the said substrate extends into the middle layer and forms a plug between the two MOS units. There is an output terminal under the substrate. When voltage is applied on both gate electrodes of the two MOS units, two conducting paths are formed from MOS unit to the plug, substrate layer and the output terminal.

As a supplement and improvement of the above technical proposal, the present invention further employs the following methods or any combination of them. Said substrate is N+ material, the middle layer is P− material; the well region is N− material. The two electrodes of the MOS unit in the middle layer are of N+ material; the two electrodes of the MOS unit on the well region are of P+ material.

Said substrate is of P+ material, the middle layer is of N− material, the well region is of P− material. The two electrodes of the MOS unit on the middle layer are of P+ material. Both electrodes of the MOS unit on the well region are of N+ material.

The invention can also use the scheme as follows.

The vertical complementary FET comprises at least two MOS units. It includes a substrate layer and a middle-layer on top of the substrate layer. The two MOS units are on the middle layer and share one electrode. Another two electrodes serve as input terminal. The PN polarities of these three electrodes are of the same and are contrary to the middle layer. A part of the said substrate extends into the middle layer and forms a plug connecting to the common electrode. There is an output terminal under the substrate layer. The PN polarity of the substrate layer is the same as that of the electrode. When voltage is applied on both gate electrodes of the two MOS units, two conducting paths are formed from MOS units to the plug, substrate layer and the output terminal.

As a supplement and improvement of the above technical proposal, the present invention further employs the following methods or any combination of them. Said substrate is of N+ material. Middle layer is of P− material. The two electrodes of the MOS unit in the middle layer are of N+ material.

Said substrate is of P+ material, middle layer is of N− material. The two electrodes of the MOS unit on the middle layer are of P+ material.

Between the drain and gate electrodes of the said MOS unit, there is a lightly doped drain region, which is used to improve the breakdown voltage of the chip effectively.

Beneficial effects: By guiding the current flow vertically by the vertical plug, the present invention replaces the lateral structure with the vertical structure, which avoids the self-bias effect created by the lateral side current. Moreover, only two current terminals are on the chip surface, which helps increase the die size, power density and the output current of the converter. With LDD technology, because of the middle layer, the breakdown voltage can be effectively improved and the device works more safely. The invention can be realized by the modified CMOS technology. Beside the device described by the invention, the standard analog and digital IC can also be realized.

DETAILED DESCRIPTION OF THE INVENTION

Figure 1:
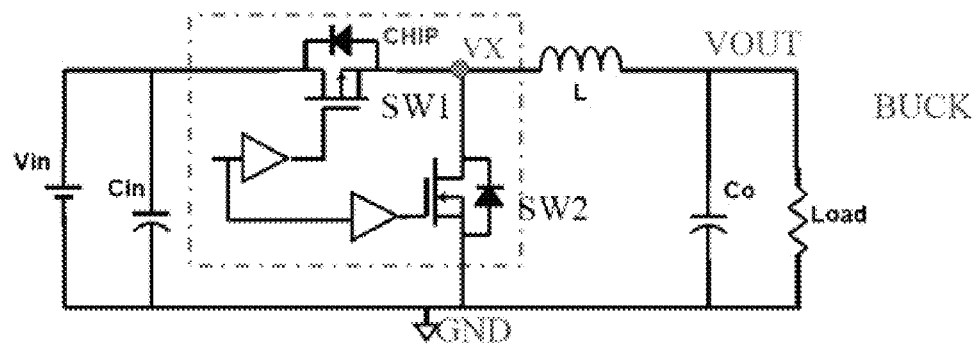
FIG. 1 is the schematic of DC-DC converter.
Figure 2:
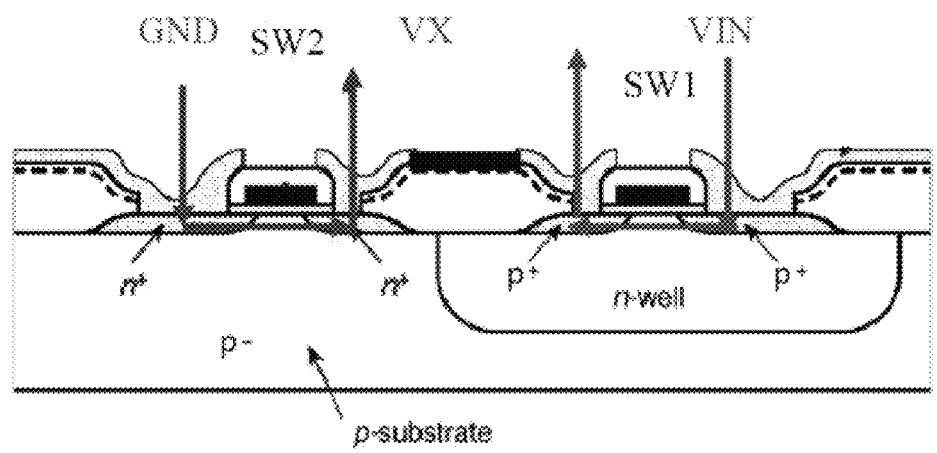
FIG. 2 is the current illustration of the chip structure of the DC-DC converter.
Figure 3:
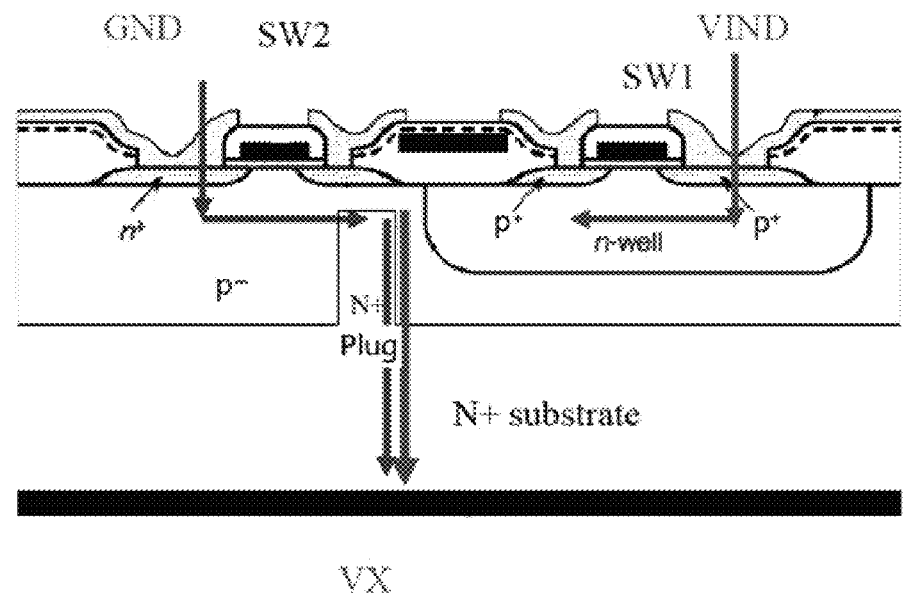
FIG. 3 is the illustration of the chip structure of the present invention

Embodiment One:

FIG. 3 shows the vertical complementary FET, in which P-middle layer is on the N+ substrate, middle layer is epi layer. There is N-well layer in the P-middle layer. MOS unit SW1 and SW2 are located on the P-middle layer and N-well layer, respectively. A part of the N+ substrate extends into the middle layer to form the N+ plug. The output terminal is located under the N+ substrate. The drain electrode of SW1 and source electrode of SW2 are connected to two current terminals connecting to Vin and GND, respectively. The output terminal is used to provide the voltage potential VX. The direction of current flow is shown by the arrow in the drawing. The current mainly flows vertically. Hence, avoid the self-bias effect of the lateral structure.

Embodiment Two

Figure 4:
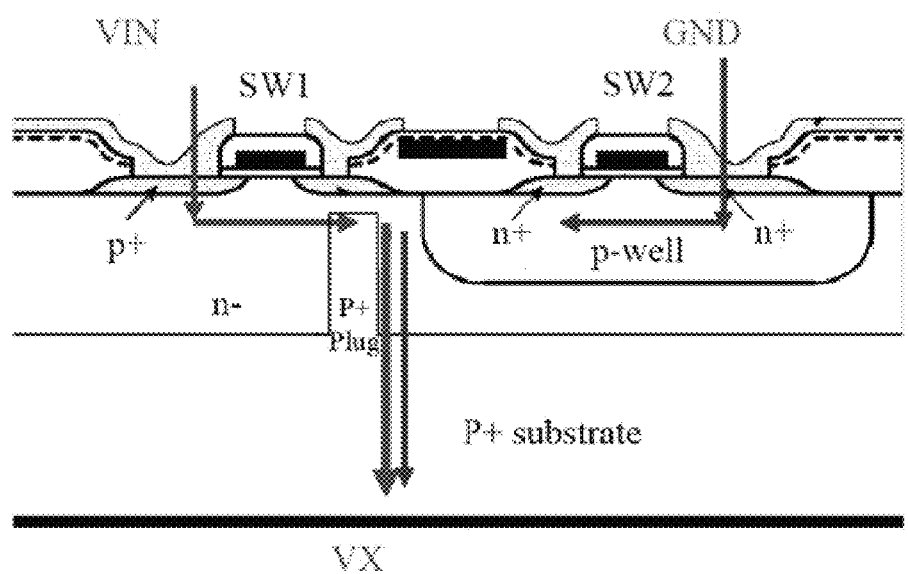
FIG. 4 is another illustration of the chip structure of the present invention

FIG. 4 shows the vertical complementary FET, the structure of which is similar the embodiment one. The difference is the contrary of the PN polarity.

Embodiment Three

Figure 5:
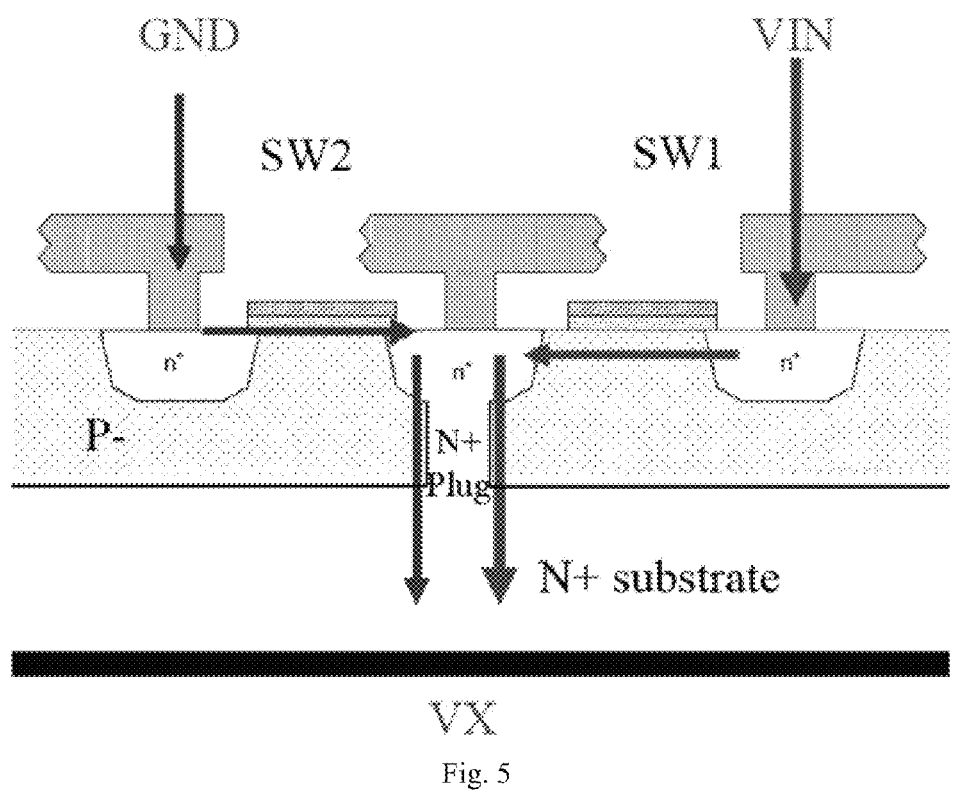
FIG. 5 is another illustration of the chip structure of the present invention

FIG. 5 shows the vertical complementary FET, in which P-middle layer is on N+ substrate. The middle layer could be P-epi layer or P-well. The MOS units of SW1 and SW2 share one electrode. All three electrodes are on the middle layer. A part of the N+ substrate extends into the middle layer and forms an N+ plug as a shared electrode. Under the N+ substrate is an output terminal. SW1 and SW2 are isolated by N+ plug, which avoids the effect of side current more effectively. The direction of the cell current is shown by the arrow in the drawing.

Embodiment Four

Figure 6:
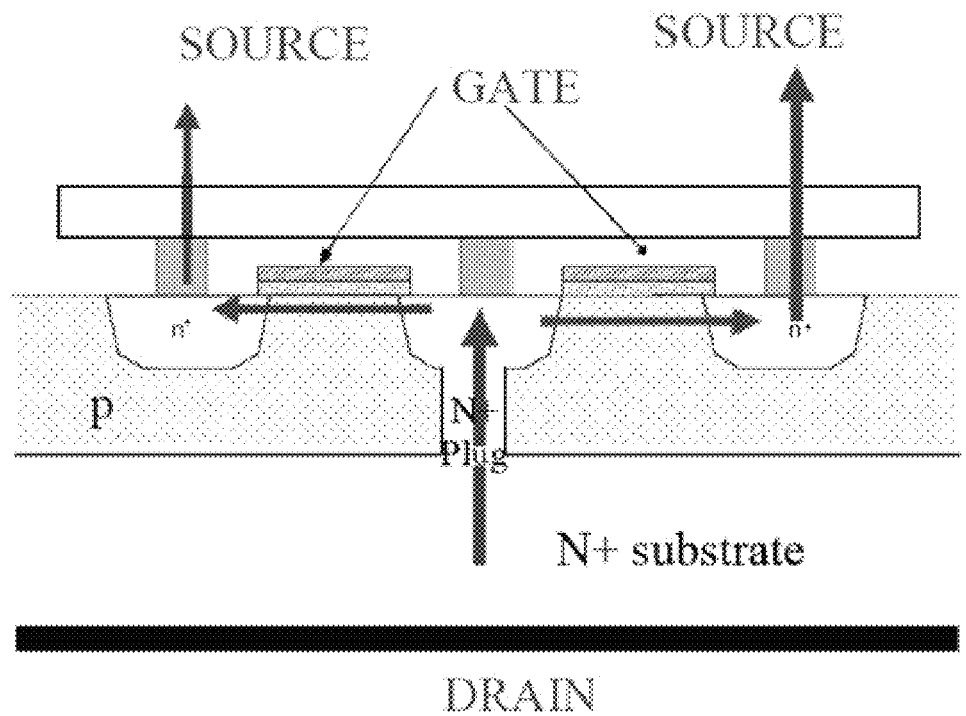
FIG. 6 is the structural drawing of a single MOS switch of the present invention

By a minor modification of embodiment three, the structure disclosed by the present invention can be used to the field of single MOS (FIG. 6), where three electrodes on the chip surface are connected. In this structure, the surface electrode is source, the bottom output is drain. By controlling the gate of SW1 and SW2 of MOS unit, the drain current can be adjusted.

Figure 7:
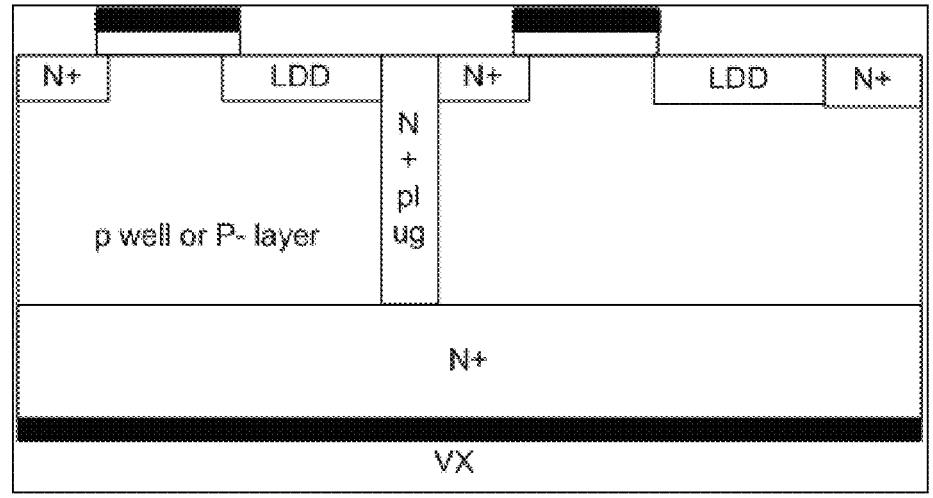
FIG. 7 is the structural drawing of the present invention with LDD region

In principle, the plug of the present invention can be located in every unit of N-MOS or P-MOS, or in several units of N-MOS or P-MOS. In order to improve the breakdown voltage, LDD is introduced into the drain and gate electrodes of MOS unit. The breakdown voltage (BV) of chip is improved effectively as shown in FIG. 7.

Experiment shows the performance of the vertical complementary FET when BV is 10V as follows. Its Ron (on-state resistance) is 1.8 mohm@2V (1.8 mohm@2V means the on-state resistance is 1.8 mohm when gate voltage is from 0 to 2V.), Qgd (gate-drain Charge) is 1 nC (Vds=5V), FOM (Figure of Merit) 1.8 mohm-nC, Qg (gate charge) is 30 nC@2V. (30 nC@2V means gate charge is 30 nC when gate voltage changes from 0 to 2V.) When BV is 35V, Ron is 3.7 mohm@5V, Qgd is 2 nC, FOM is 7.4 mW-nC.

As demonstrated, the performance is similar to that of the standard CMOS.

It should be pointed out that the specific embodiments only present the theory and function of the invention. They do not limit the invention. Anyone with ordinary skill in the art can make modifications to embodiments above without departing from the scope of the present invention. Therefore, it is intended that this invention is shown in the claims.

The invention claimed is:

1. A vertical complementary field effect transistor (FET), which comprises at least two MOS units, characterized in that it further comprises a substrate layer and a middle-layer on top of the substrate layer; the two MOS units are on the middle layer and share one electrode; another two electrodes serve as input terminal; the PN polarity of these three electrodes are of the same and are contrary to the middle layer; a part of the said substrate extends into the middle layer and forms a plug connecting to the common electrode; there is an output terminal under the substrate layer; the PN polarity of the substrate layer is the same as that of the electrode; when voltage is applied on both gate electrodes of the two MOS units, two conducting paths are formed from the MOS unit to the plug, substrate layer and the output terminal.

2. The vertical complementary FET of claim 1, wherein said substrate is of N+ material; the middle layer is P− material; the well region is N− material; two electrodes of the MOS unit on the middle layer are of N+ material.

3. The vertical complementary FET of claim 1, wherein said substrate is of P+ material; the middle layer is N− material; the well region is N− material; two electrodes of the MOS unit on the middle layer are of P+ material.

4. The vertical complementary FET of claim 1, wherein said MOS units have LDD between drain and gate electrodes to improve the breakdown voltage of the chip.

* * * * *